(12) United States Patent
Ishikawa

(10) Patent No.: US 6,310,913 B1
(45) Date of Patent: Oct. 30, 2001

(54) CIRCUIT AND METHOD FOR MODULATING PULSE WIDTH

(75) Inventor: Yoji Ishikawa, Machida (JP)

(73) Assignee: Asahi Kasei Kabushiki Kaisha, Osaka (JP)

( * ) Notice: Subject to any disclaimer, the term of this patent is extended or adjusted under 35 U.S.C. 154(b) by 0 days.

(21) Appl. No.: 09/194,011

(22) PCT Filed: May 20, 1997

(86) PCT No.: PCT/JP97/01698

§ 371 Date: Nov. 19, 1998

§ 102(e) Date: Nov. 19, 1998

(87) PCT Pub. No.: WO97/44899

PCT Pub. Date: Nov. 27, 1997

(30) Foreign Application Priority Data

May 20, 1996 (JP) .................................... 8-124630

(51) Int. Cl.$^7$ .................................. H03K 7/08; H03K 9/08
(52) U.S. Cl. ............................................. 375/238; 332/109
(58) Field of Search .......................... 375/238; 332/109, 332/110, 111; 327/176, 175, 177

(56) References Cited

U.S. PATENT DOCUMENTS

| | | | |
|---|---|---|---|
| 5,119,045 | * 6/1992 | Sato | 332/109 |
| 5,481,560 | * 1/1996 | Potetz et al. | 375/238 |
| 5,553,096 | * 9/1996 | Messman | 375/238 |
| 5,852,632 | * 12/1998 | Capici et al. | 375/238 |
| 5,880,644 | * 3/1999 | Schmidt et al. | 332/109 |
| 6,023,199 | * 2/2000 | Cheung | 332/109 |

FOREIGN PATENT DOCUMENTS

| | | |
|---|---|---|
| 64-36118 | 2/1989 | (JP) . |
| 64-37124 | 2/1989 | (JP) . |
| 2-219321 | 8/1990 | (JP) . |
| 3-76311 | 4/1991 | (JP) . |
| 3-76312 | 4/1991 | (JP) . |
| 4-295280 | 10/1992 | (JP) . |
| 4-318469 | 11/1992 | (JP) . |
| 6-53794 | 2/1994 | (JP) . |
| 6-311040 | 11/1994 | (JP) . |
| 7-503590 | 4/1995 | (JP) . |
| 7-135469 | 5/1995 | (JP) . |
| 8-88566 | 4/1996 | (JP) . |
| WO 93/24999 | 12/1993 | (WO) . |

* cited by examiner

Primary Examiner—Chi Pham
Assistant Examiner—Phuong Phu
(74) Attorney, Agent, or Firm—Finnegan, Henderson, Farabow, Garrett & Dunner, L.L.P.

(57) ABSTRACT

Signal $C=[C_{n-1}, C_{n-2}, \ldots, C_1, C_0]$ generated by a ring counter 1 is converted at a logic circuit 2 to a triangle pulse signal Q in which the carrier frequency of the PWM signal is equal to the frequency of the signal C raised to power of 2. The signal Q is input to the B input of a magnitude comparator 3. On the other hand, the modulation data D held by a data holding circuit 4 is compared with the converted signal Q in the magnitude comparator 3, and when the data D is greater than the signal Q, a PWM signal is obtained from the comparison result A>B. This PWM signal has no phase change and high resolution and is a low pulsating component. The resolution of the PWM signal per cycle of the ring counter 1 is held at n bits, and the carrier frequency is equal to the ring counter frequency raised to mth power of 2.

16 Claims, 12 Drawing Sheets

CIRCUIT AND METHOD FOR MODULATING PULSE WIDTH

TECHNICAL FIELD

The present invention relates generally to a pulse width modulation (PWM) circuit and method, and more particularly to a PWM circuit and method applicable to D/A converters for converting a digital signal to an analog signal, communication circuits, and control circuits such as an inverter for driving a power device such as a motor.

BACKGROUND ART

First Prior Art

In a first conventional analog type PWM circuit, a PWM signal is obtained by comparing an isosceles triangle reference signal and a signal to be modulated (referred to as a modulation signal, hereinafter) with a comparator. In this case there is no phase change of the PWM signal dependent on the magnitude of the modulation signal.

On the other hand, there is a method for realizing a digital type PWM circuit. As shown in FIG. 2A, the sawtooth waveform C in the form of a right-angled triangle generated by a ring counter is used as a reference signal, and this reference signal and modulation signal D are input to a magnitude comparator, in which the magnitudes of both signals are compared with each other. The comparison result of the magnitude comparator is used as a PWM signal (PWM 1). This digital type method is easily obtained from the analog type method. This digital type method has the excellent advantage that it requires only a magnitude comparator when multi-channel PWM is realized. This method also has the feature that if the cycle to update modulation data is equal to that of the ring counter or any integral multiple of the ring counter cycle, the modulation characteristic will become ideally linear and therefore the resolution and carrier cycle of the PWM signal obtained will be equal to those of the ring counter.

Second Prior Art

On the other hand, for the specification of the PWM required of A/D converters or motor control, there is a demand to make the carrier frequency higher than the updating frequency of modulation data without degrading PWM resolution. A method for meeting this demand has been proposed in Japanese Patent Application Laying-Open No. 3-76311 filed by the same applicant as this patent application.

Another method for converting modulation data expressed in two's complement to a PWM signal by simple constitution has been proposed in Japanese Patent Application Laying-Open No. 3-76312 filed by the same applicant as this patent application.

Furthermore, other methods to the present invention have been proposed in Japanese Patent Application Laying-Open Nos. 1-36118, 1-37124, 2-219321, 4-295280, 4-318469, 6-53794, 6-311040, and 8-88566.

Regarding the First Prior Art

In the method for realizing a digital type PWM circuit, mentioned in the first prior art, the phase of the PWM signal (PWM 1) changes in dependence on the magnitude (i.e., the phase of the leading edge of each PWM signal does not change, but if the center of the high level portion of each PWM signal is thought of as the phase, the phase changes).

In order to prevent a change in the phase, an up-down counter for counting up or down clock pulses and a few control circuits are employed in generating a reference signal. Clock pulses are counted down in the first half cycle of the reference signal and counted up in the second half cycle, whereby a triangle waveform in the form of an isosceles triangle is generated. This triangle waveform may be employed as the reference signal.

The aforementioned method for preventing the phase change in the digital method, however, has the following problems.

(1) The upper limit of the resolution of the digital PWM per cycle is theoretically the number of clock pulses per cycle, but the resolution will be reduced by one bit as compared with that of the above-mentioned sawtooth reference signal. That is, for instance, in the case of a 4-bit reference signal, a sawtooth waveform signal has 16 levels consisting of levels 0 to 15, as shown in FIG. 4A (however, in this case the above-mentioned phase change will take place). If this sawtooth waveform signal is applied to the above-mentioned method for preventing the phase change in the digital method, two cycle times will be required to obtain 16 levels in each of the down-counting and up-counting. On the other hand, since one cycle has 16 clock pulses, only 8 levels, 0, 2, 4, 6, 8, 10, 12, and 14, are obtained in both the down-counting and the up-counting (i.e., the resolution is reduced by one bit). (2) The circuitry is complicated.

Regarding the Second Prior Art

Even in each method mentioned in the second prior art, as with FIG. 2A, the phase of the PWM signal changes in dependence on the magnitude. That is, the phase of the leading edge of each PWM signal does not change, but if the center of the high level portion of each PWM signal is thought of as the phase, the phase changes.

If ideal modulation is to be performed with the digital type PWM circuit mentioned in the second prior art, the carrier cycle must be equal to the clock cycle raised to second power. However, the required clock frequency of the PWM circuit does not always match with those of the peripheral circuits. Hence, the PWM circuit requires a phase-locked loop (PLL) or an exclusive clock generator to ensure a required clock frequency. Furthermore, the aforementioned conventional methods cannot meet a demand to enhance high-speed controllability, because the cycle to update modulation data is the same as the carrier cycle even when the updating cycle i s shortest.

Accordingly, it is an object of the present invention to provide a PWM circuit and method which has overcome the aforementioned problems.

Another object of the present invention is to provide a PWM circuit and method which can be realized with simple circuitry.

Still another object of the present invention is to provide a PWM circuit and method which has no phase change and has a high resolution and can gradually increase the carrier frequency arbitrarily at the low pulsating component.

A further object of the present invention is to provide a PWM circuit and method which can generate a good PWM signal even when the carrier cycle is not equal to the clock cycle raised to second power, and therefore, the object is to provide a PWM circuit and method which requires no additional exclusive clock pulse.

A still further object of the present invention is to provide a PWM circuit and method which can be realized inexpensively with a little analog waveform degradation in the case where the PWM circuit is applied to a D/A converter and a little controllability degradation in the case where the PWM circuit is applied to power control.

A still further object of the present invention is to provide a PWM circuit and method in which modulation of two's complement data and a rounding function can be realized with simple circuitry by making unnecessary a 1-adder which was required in prior art, and therefore, the object is to provide a PWM circuit and method which is capable of eliminating the problems that an offset of ½ LSB occurs when a lower bit is omitted instead of being rounded by a rounding function and that a positive 100% duty cycle cannot be output.

DISCLOSURE OF THE INVENTION

To achieve the aforementioned objects and in accordance with one aspect of the present invention, there is provided a pulse width modulation circuit comprising:

In a first aspect of the present invention, there is provided a pulse width modulation circuit comprising:
signal output means for outputting an n-bit signal reiteratedly at a predetermined frequency, the n-bit signal increasing or decreasing stepwise in sequence to a predetermined value;
conversion means for converting the n-bit signal output from the signal output means to a reference signal which reiterates a sequential decrease and a sequential increase or reiterates a sequential increase and a sequential decrease at a frequency which gradually increases the predetermined frequency;
modulation signal output means for outputting modulation signal; and
comparison means for comparing the modulation signal output from the modulation signal output means with the reference signal output from the conversion means and then to output the result of comparison as a pulse width modulation signal.

Here, the conversion means may convert all bit values of the n-bit signal so that one of the even and odd bit values decreases or increases in sequence in the first half cycle of the cycle of the reference signal and also the other of the even and odd bit values increases or decreases in sequence in the remaining half cycle, when the reference signal with the same cycle as that of the n-bit signal output from the signal output means is output.

The conversion means may have exclusive NOR circuits, the number of the exclusive NOR circuits being less than the number of bits of the n-bit signal by one, and for input and output bits with respect to the exclusive NOR circuits, the input most significant bit being connected to the output least significant bit of output bits and also being connected to first input terminals of the exclusive NOR circuits, the output terminals of the exclusive NOR circuits being connected to the remaining output bits in sequence in order of higher bits, and the remaining input bits being connected in sequence in order of bits closer to the most significant bit to second input terminals of the exclusive NOR circuits connected in order of the connection.

In the conversion means, an n-bit signal expressed by $C=[C_{n-1}, C_{n-2}, \ldots, C_1, C_0]$ may be converted to a reference signal expressed as $$Q = [\overline{C_{n-m-2} \oplus C_{n-m-1}}, \ldots, \overline{C_1 \oplus C_{n-m-1}}, \overline{C_0 \oplus C_{n-m-1}},$$

-continued
$$C_{n-m-1}, \ldots, C_{n-2}, C_{n-1}]$$

where Q is the reference signal, $\oplus$ is an exclusive OR, and m=0, 1, . . . , and (n−1).

The conversion means may arbitrarily invert and output lower (m+1) bits of the reference signal Q.

The modulation signal may further have a bit to be rounded and the comparison means may have:
a comparator having input terminals A to which bits of the modulation signal excluding the bit to be rounded are input and input terminals B to which output bits of the reference signal output means are input, the comparator outputting comparison results A>B and A=B of both inputs;
a first logic circuit for outputting a logical product between the comparison result A=B and the bit to be rounded; and
a second logic circuit for outputting a logical sum between the logical product of the first logic circuit and the comparison result A>B as the pulse width modulation signal.

The signal output means may have an (n−m) bit down counter where m=0, 1, . . . , and (n−1) and the conversion means may have:
a logic circuit for making an exclusive OR between the bit (n−m−1) and bits 0 to (n−m−2) of the (n−m) bit down counter equal to the bits (m+1) to (n−1) of the reference signal;
means for making the most significant bit of the (n−m) bit down counter equal to the bit m of the reference signal; and
an m-bit counter for performing counting once in 1 cycle of the (n−m) bit down counter and make the bits 0 to (m−1) of the (n−m) bit down counter equal to the bits (m−1) to 0 of the reference signal.

The conversion means may arbitrarily invert and output lower (m+1) bits of the reference signal Q.

The conversion means may have:
an n-bit shifter for shifting and output the n-bit signal from the signal output means to an m-bit higher position in response to a set value m;
(n−1) exclusive NOR circuits each having a first input terminal to which the most significant bit of the outputs of the n-bit shifter is input and a second input terminal to which each bit of the remaining outputs of the n-bit shifter is input;
switch means including (n−1) switches, each having two input terminals and one output terminal, in response to the set value m the lower m switches each outputting its lower input and the remaining switches each outputting its upper input, and when m =0, all the switches outputting upper inputs;
the outputs of the (n−1) exclusive NOR circuits being input to the upper terminals of the (n−1) switches, and the (n−1) bits of the n-bit signal from the signal output means, excluding the most significant bit, being input to the lower terminals of the (n−1) switches in reversed order; and
means for outputting the most significant bit of the n-bit signal from the signal output means as the least significant bit of the reference signal, and the outputs of the (n−1) switches of the switch means as the remaining (n−1) higher bits of the reference signal.

The conversion means may arbitrarily invert and output lower (m+1) bits of the reference signal Q.

The frequency of the reference signal from the conversion means may be ½ of the updating frequency of the modulation signal and a change point between the increase and decrease of the reference signal may be matched with the updating timing of the modulation signal.

The modulation signal may be data expressed in 2's complement and the comparison means may have:

a first logic circuit for outputting an exclusive OR between the sign bit and each of the remaining bits of the modulation signal;

a comparator having an input terminal A to which the output of the first logic circuit is input and an input terminal B to which the output of the conversion means is input, the comparator outputting comparison results A>B and A=B of both inputs;

a second logic circuit for outputting a logical product between the comparison result A=B and the sign bit; and a third logic circuit for outputting a logical sum between the logical product of the second logic circuit and the comparison result A>B as the pulse width modulation signal.

The modulation signal may further have a bit to be rounded;

the first logic circuit further outputs an exclusive OR between the bit to be rounded and the sign bit of the modulation signal; and the second logic circuit outputs a logical product between the exclusive OR from the first logic circuit and the comparison result A=B.

In a second aspect of the present invention, there is a pulse width modulation method comprising the steps of:

converting an n-bit signal to a reference signal which reiterates a sequential decrease and a sequential increase or reiterates a sequential increase and a sequential decrease at a frequency which gradually increases a predetermined frequency, the n-bit signal increasing or decreasing stepwise in sequence and being reiterated at the predetermined frequency; and comparing a modulation signal and the reference signal with each other and outputting the result of comparison as a pulse width modulation signal.

Here, in the conversion, an n-bit signal expressed by $C=[C_{n-1}, C_{n-2}, \ldots, C_1, C_0]$ may be converted to a reference signal expressed as $$Q = [\overline{C_{n-m-2} \oplus C_{n-m-1}}, \ldots, \overline{C_1 \oplus C_{n-m-1}}, \overline{C_0 \oplus C_{n-m-1}},$$
$$C_{n-m-1}, \ldots, C_{n-2}, C_{n-1}]$$

where Q is the reference signal, $\oplus$ is an exclusive OR, and m=0, 1, ..., and (n−1), and lower (m+1) bits of the reference signal Q can be arbitrarily inverted.

BRIEF DESCRIPTION OF THE DRAWINGS

The present invention will be described in further detail with reference to the accompanying drawings wherein.

BEST MODE FOR CARRYING OUT THE INVENTION

Preferred embodiments of the present invention will hereinafter be described in detail with reference to the drawings.

Figure 1:
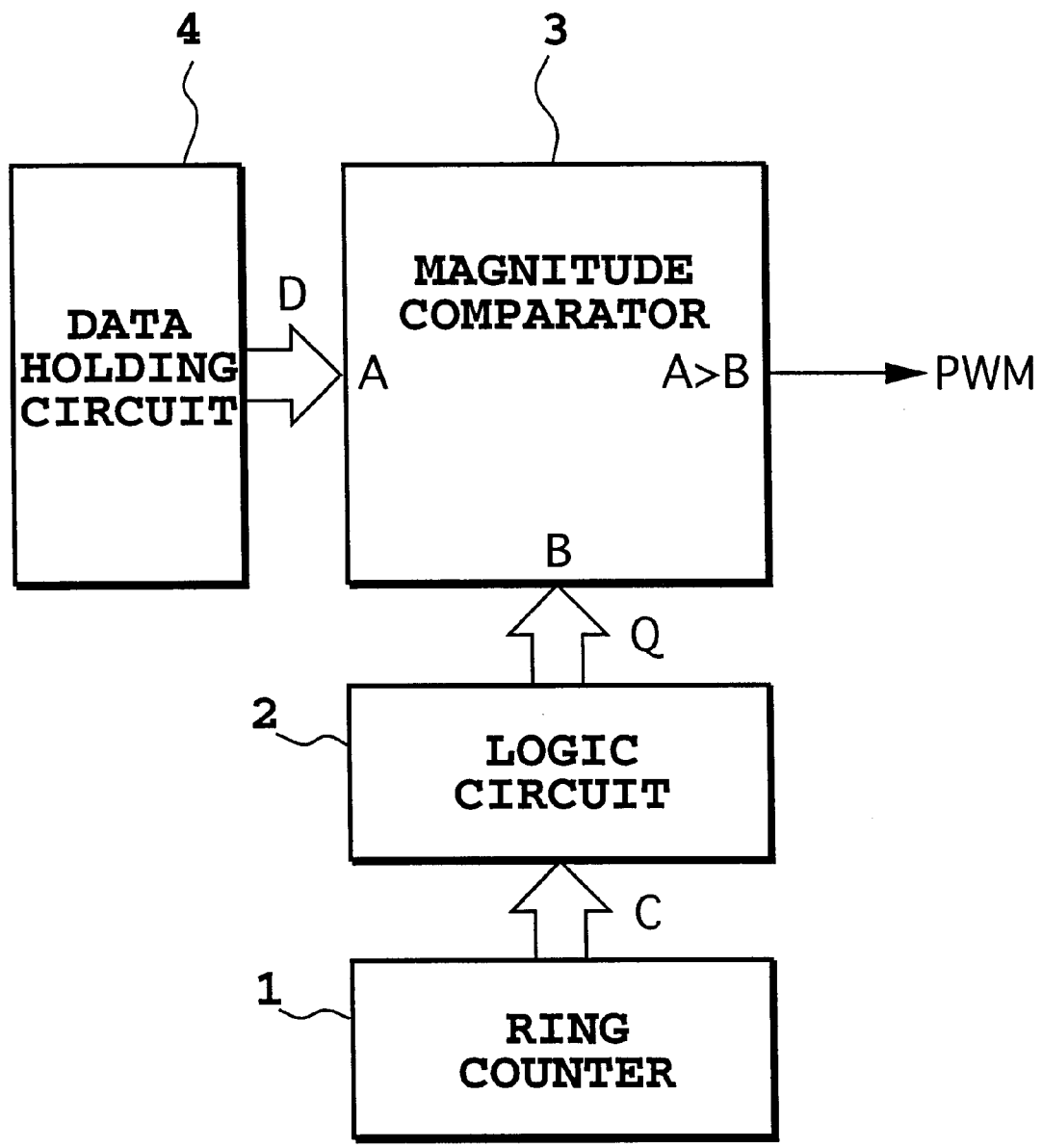
FIG. 1 is a block diagram of a first embodiment of the present invention.

In FIG. 1 which shows a first embodiment of the present invention, reference numeral 1 denotes a ring counter. The ring counter 1 counts clock pulses in cycles to generate and output serially a right-angled triangular sawtooth pulse signal having a certain relationship with the cycle of a reference signal. Such means to generate and output a right-angled triangular sawtooth pulse signal serially is not limited to the ring counter 1. For example, even by storing data equivalent to a right-angled triangular sawtooth pulse signal in memory such as a ROM and reading out the stored data in sequence, a pulse signal equivalent to a right-angled triangular sawtooth pulse signal can be serially obtained. The signal $C=[C_{n-1}, C_{n-2}, C_1, \ldots, C_0]$ generated by this ring counter 1 is converted at a logic circuit 2 to reference signal Q:

$$Q = [\overline{C_{n-m-2} \oplus C_{n-m-1}}, \ldots, \overline{C_1 \oplus C_{n-m-1}}, \overline{C_0 \oplus C_{n-m-1}},$$
$$C_{n-m-1}, \ldots, C_{n-2}, C_{n-1}]$$

where $\oplus$ is an exclusive OR, and m=0, 1, ..., and (n−1).

The generated reference signal Q is input to the B input of a magnitude comparator 3. On the other hand, the modulation data D held by a data holding circuit 4 is input to the A input of a magnitude comparator 3. The data holding circuit 4 has a function of holding data during each data updating cycle, and therefore, the data holding circuit 4 can be realized, for example, by a latched circuit, a register, a RAM, etc. In the magnitude comparator 3, the magnitudes of the signals Q and D are compared with each other, and only when the A input is greater than the B input, a PWM signal is obtained from the A>B output. At this time, the resolution of the PWM signal per cycle of the ring counter 1 is held at n bits, and the carrier frequency is equal to the ring counter frequency raised to mth power of 2.

Figure 2A:
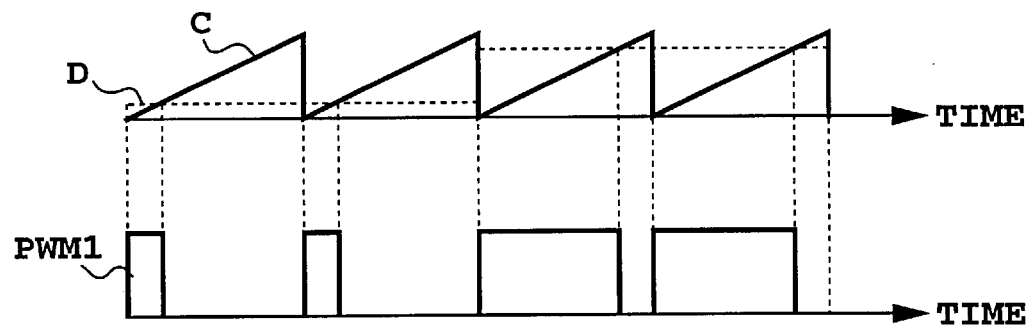
FIGS. 2A and 2B are diagrams used to explain an input signal and an output signal of each section.
Figure 2B:
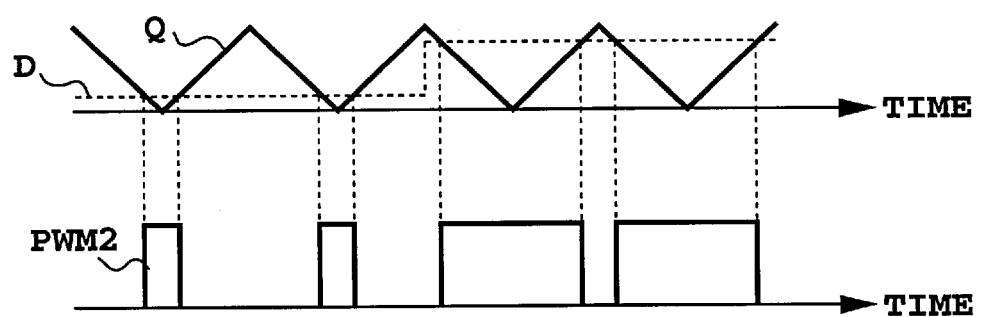
Figure 3:
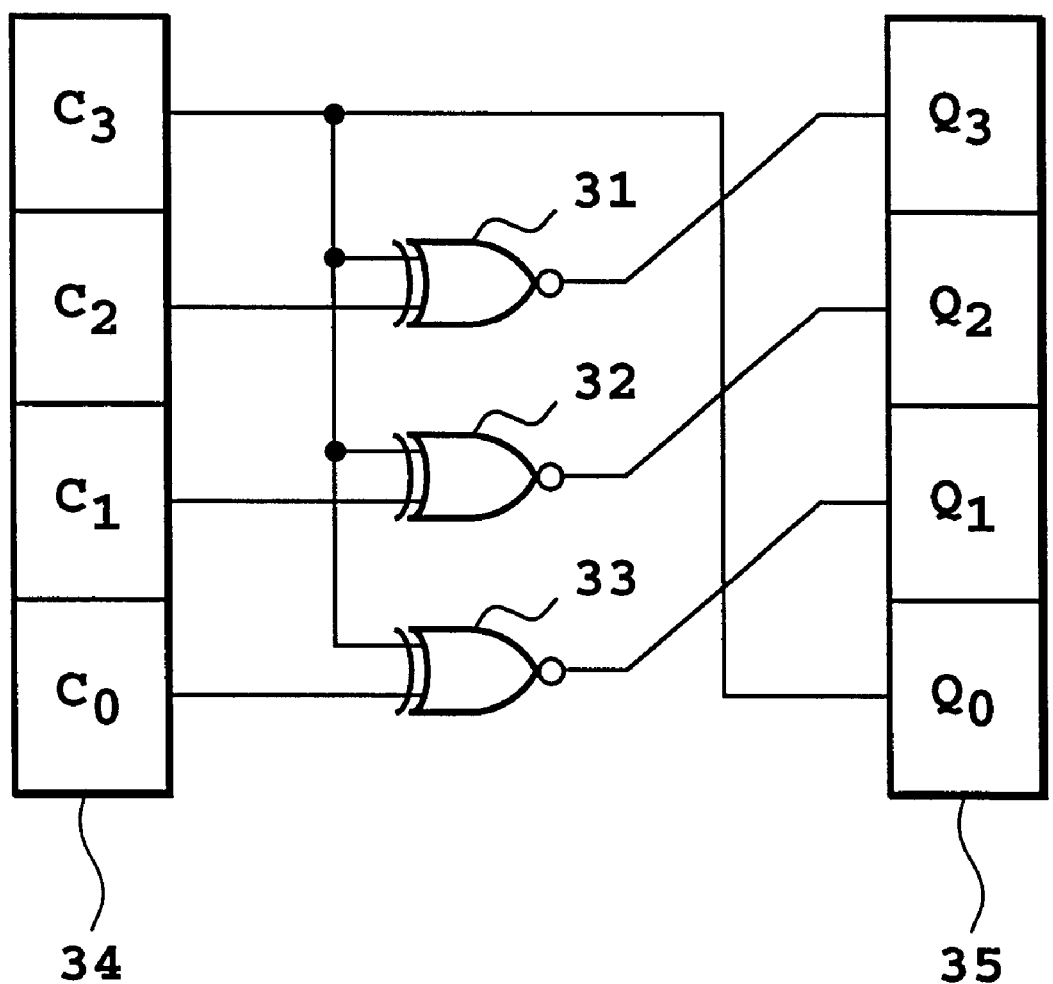
FIG. 3 is a diagram showing an embodiment of a logic circuit.

When, on condition that the updating cycle of the modulation data D is twice the cycle of the ring counter 1, the modulation data D is input to the A input of the magnitude comparator 3 and the output signal C of the ring counter 1 is input directly to the B input of the magnitude comparator 3, the output is obtained as shown in FIG. 2A. On the other hand, in the present invention shown in FIG. 1, if the m in the logic circuit 2 is taken to be m =0 (i.e., the cycle of the output C of the ring counter 1 and the cycle of the output Q of the logic circuit 2 are the same) and if the output signal C of the ring counter 1 is input to the logic circuit 2 and the reference signal Q output by the logic circuit 2 is input to the B input of the magnitude comparator 3, then the reference signal Q and PWM signal will be obtained as shown in FIG. 2B. That is, it is found that the phase of the PWM signal (PWM 2) is constant without depending on the duty cycle and does not change. Next, the logic circuit 2 in the case of m=0 will be described in detail. When the resolution of the PWM signal is expressed as 4 bits, the logic circuit 2 for realizing the aforementioned equation is constituted as shown in FIG. 3. That is, 3 exclusive NOR circuits 31 to 33 are arranged between an input register 34 to which 4-bit data ($C_3$, $C_2$, $C_1$, $C_0$) is input and an output register 35 which outputs 4-bit data ($Q_3$, $Q_2$, $Q_1$, $Q_0$). Suppose that bit $C_3$ is an input most significant bit, bit $Q_3$ an output most significant bit, bit $C_0$ an input least significant bit, and bit $Q_0$ an output least significant bit. The input most significant bit $C_3$ is connected to the output least significant bit Qo and the upper input terminals of the 3 exclusive NOR circuits 31 to 33. The input bit $C_2$ is connected to the lower input terminal of the first exclusive NOR circuit 31, and the output terminal of the first exclusive NOR circuit 31 is connected to the output most significant bit $Q_3$. The input bit $C_1$ is connected to the lower input terminal of the second exclusive NOR circuit 32, and the output terminal of the second exclusive NOR circuit 32 is connected to the output bit $Q_2$. The input least significant bit $C_0$ is connected to the lower input terminal of the third exclusive NOR circuit 33, and the output terminal of the third exclusive NOR circuit 33 is connected to the output bit $Q_1$.

Figure 4A:
FIGS. 4A and 4B are waveform diagrams of the input and output signals of the logic circuit.
Figure 4B:
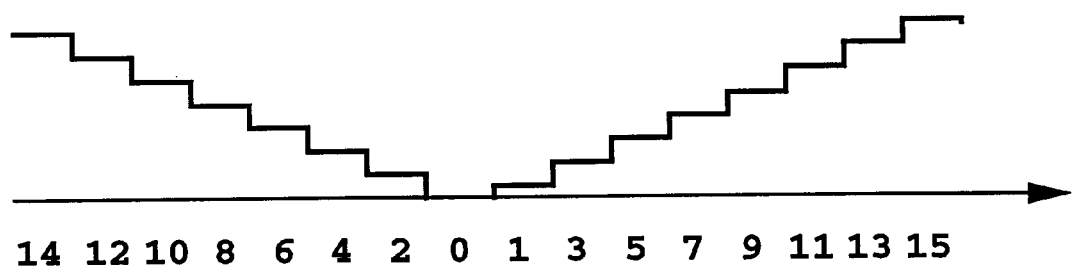

In the logic circuit 2 constituted as described above, if 4-bit signal C with 16 levels consisting of values of 0 to 15 such as the one shown in FIG. 4A is input from the ring counter 1 to the logic circuit 2, even values will decrease in sequence for the first half cycle of the input signal and odd values will increase in sequence for the second half cycle, as shown in FIG. 4B. That is, output signal Q with 16 levels consisting of all values of 0 to 15 in total will be obtained. As a result, in the magnitude comparator 3, the magnitude of the modulation signal D from the data holding circuit 4 is compared with the magnitude of the reference signal Q with 16 levels consisting of values of 0 to 15 at every cycle, and the resolution of the PWM signal from the magnitude comparator 3 has the maximum value theoretically. Note that the logic circuit 2 is not limited to that shown in FIG. 3. For instance, the reference signal Q can be serially obtained, even by storing the data of the reference signal equivalent to 1 cycle of the ring counter 1 in memory such as a ROM, accessing with each output of the ring counter 1 each address of the memory in which that data was stored, and by reading out the stored data in sequence.

Figure 5A:
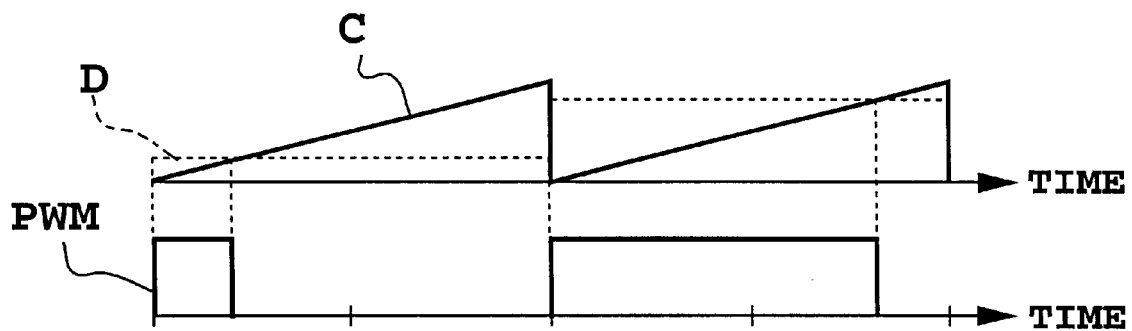
FIGS. 5A and 5B are diagrams used to explain another input signal and another output signal of each section.
Figure 5B:
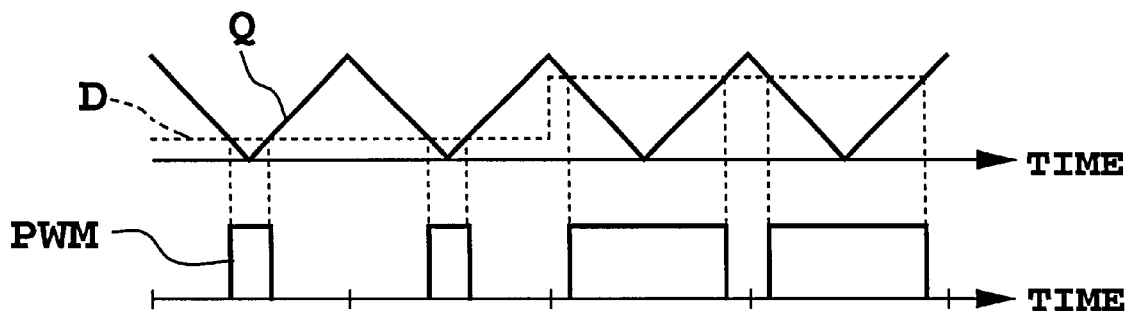

If, on condition that the updating cycle of the modulation data D is the same as the cycle of the ring counter 1, the modulation data D is input to the magnitude comparator 3 and the output signal C of the ring counter 1 is input directly to the magnitude comparator 3, the output will be obtained as shown in FIG. 5A. On the other hand, in the present invention shown in FIG. 1, if the m in the logic circuit 2 is taken to be m=1 (i.e., the cycle of the output Q of the logic circuit 2 is half the cycle of the output C of the ring counter 1) and if the output signal C of the ring counter 1 is input to the logic circuit 2 and the reference signal Q output by the logic circuit 2 is input to the magnitude comparator 3, then the reference signal Q and PWM signal will be obtained as shown in FIG. 5B. That is, it is found that the phase of the PWM signal is constant without depending on the duty cycle and does not change.

Figure 6:
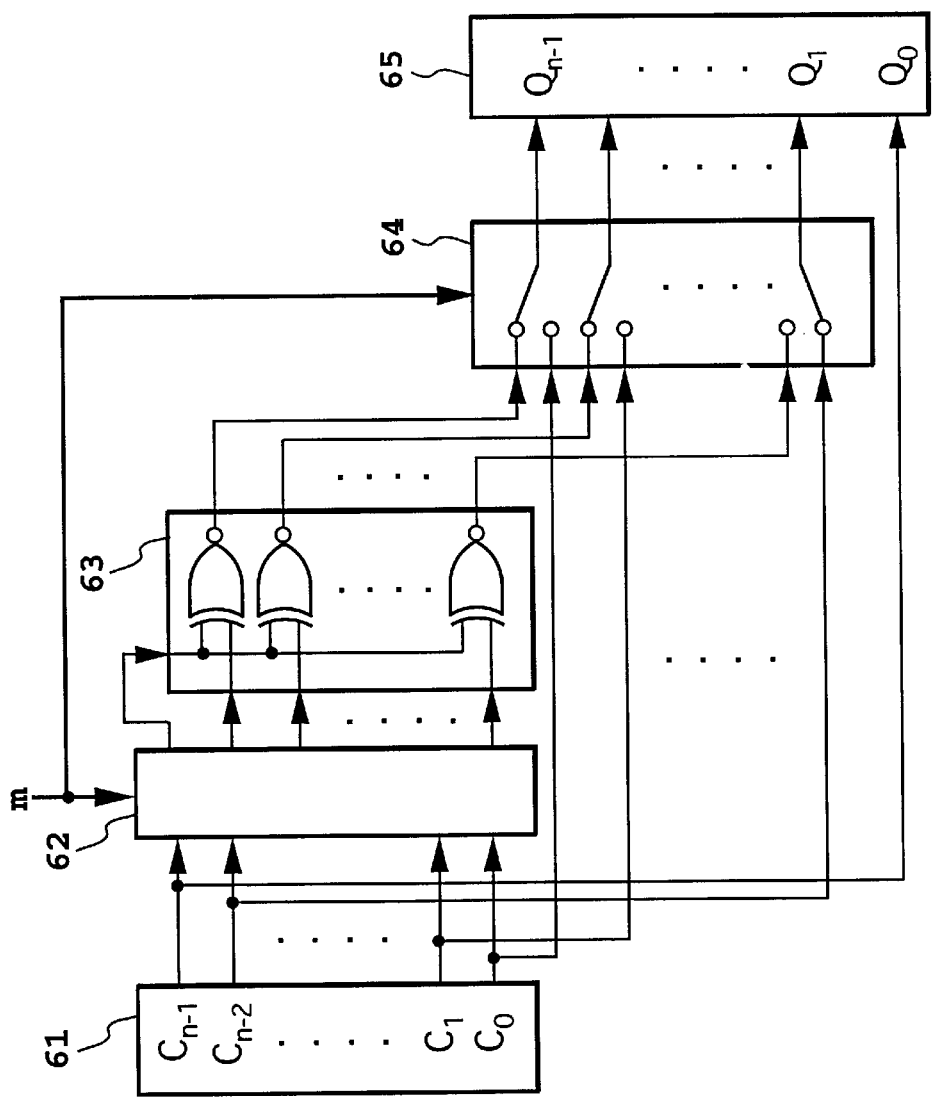
FIG. 6 is a diagram showing another embodiment of the logic circuit.

Next, an example of the logic circuit 2 which realizes the aforementioned m from m=0 to (n–1) will be described based on FIG. 6. In the figure, reference numeral 61 denotes an n-bit ring counter. 62 is an n-bit shifter, which shifts and outputs input to an m-bit higher position in response to a set value m. 63 is (n–1) one-bit comparators ((n–1) exclusive NOR circuits). 64 is (n–1) switches (multiplexers) with two input terminals and one output terminal, and in response to the set value m, lower m switches output their lower inputs, and the remaining switches output their upper inputs. When the set value m is zero, all upper inputs are output. 65 is an n-bit register which outputs an n-bit reference signal Q. The n outputs of the n-bit counter 61 are input to the n input terminals of the n-bit shifter 62, respectively. The most significant bit of the n outputs of the n-bit shifter 62 is input to an upper input terminal of each one-bit comparator 63, while the remaining outputs of the n-bit shifter 62 are input to the lower input terminals of all one-bit comparators 63, respectively. All outputs of one-bit comparators 63 are input to the upper input terminals of the (n–1) switches 64, respectively. The (n–1) bit outputs of the n-bit counter 61 excluding the most significant bit are input to the lower input terminals of the (n–1) switches 64 in reversed order, respectively. The n-bit register 65 outputs the MSB signal of the n-bit counter 61 as the LSB signal Qo of the n-bit reference signal Q and also outputs the output signals of the (n–1) switches 64 as the (n–1) higher bit reference signals $Q_{n-1}$ to $Q_1$ of the n-bit reference signal Q. According to such constitution, n-bit reference signal Q can be obtained so that it corresponds to all values of the n-bit output signal of the n-bit counter 61 from m–0 to (n–1). Also, among the signals input to the n-bit register 65, each logic of lower (m+1) bits can be arbitrarily inverted, for example, by a required number of inverters.

Figure 7A:
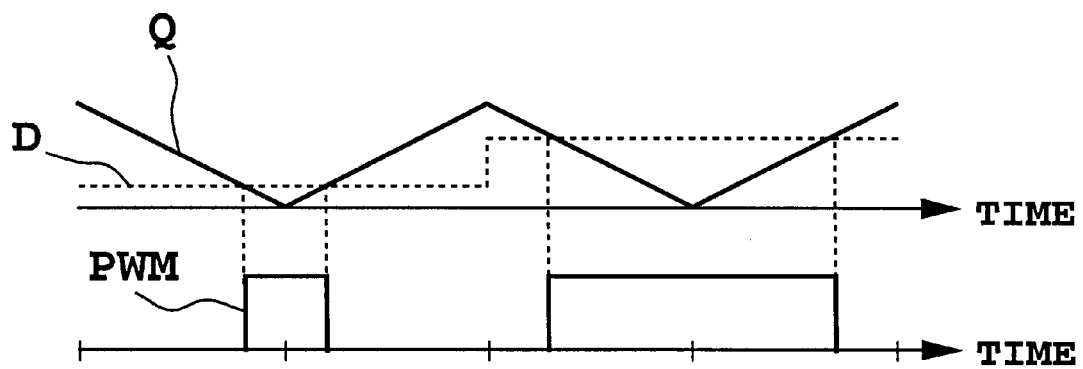
FIGS. 7A and 7B are diagrams used to explain still another input signal and still another output signal of each section.
Figure 7B:
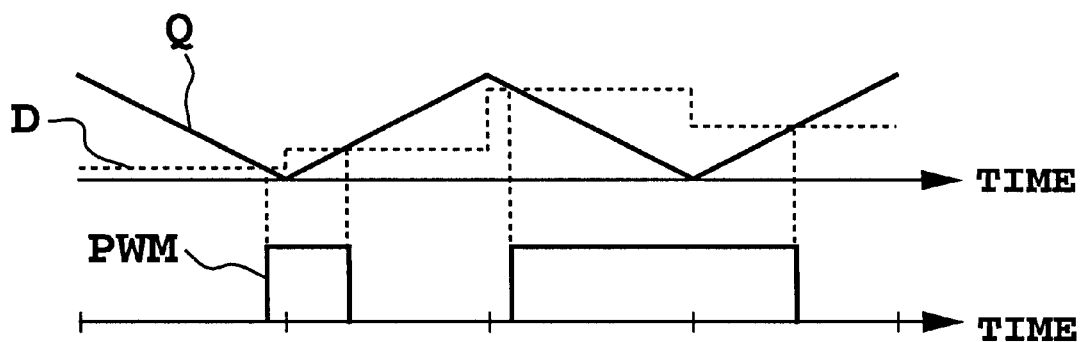

Furthermore, the PWM whose carrier frequency is half the updating frequency of modulation data can be easily realized by updating modulation data at each transition point between the increase and decrease in the n-bit reference signal Q with the PWM circuit of FIG. 1. FIG. 7A shows the waveform in the case where in the PWM circuit of FIG. 1 the modulation data D was updated in a cycle which is the same cycle as the carrier cycle, while FIG. 7B shows the waveform in the case where the modulation data D was updated in a cycle which is half of the carrier cycle. Although the resolution in FIG. 7B per modulation data is ½ of that of FIG. 7A, the resolutions in FIGS. 7A and 7B per pulse are the same. Even if the pulse widths in FIGS. 7A and 7B are the same, it is found that the case in FIG. 7B is superior because it has a degree of freedom in phase.

While the aforementioned PWM circuit based on the constitution of FIG. 1 supposes the case where the updating cycle of modulation data or the carrier cycle can be selected as the clock cycle raised to second power, a case other than that will be described as a second embodiment by the following circuit.

Figure 8:
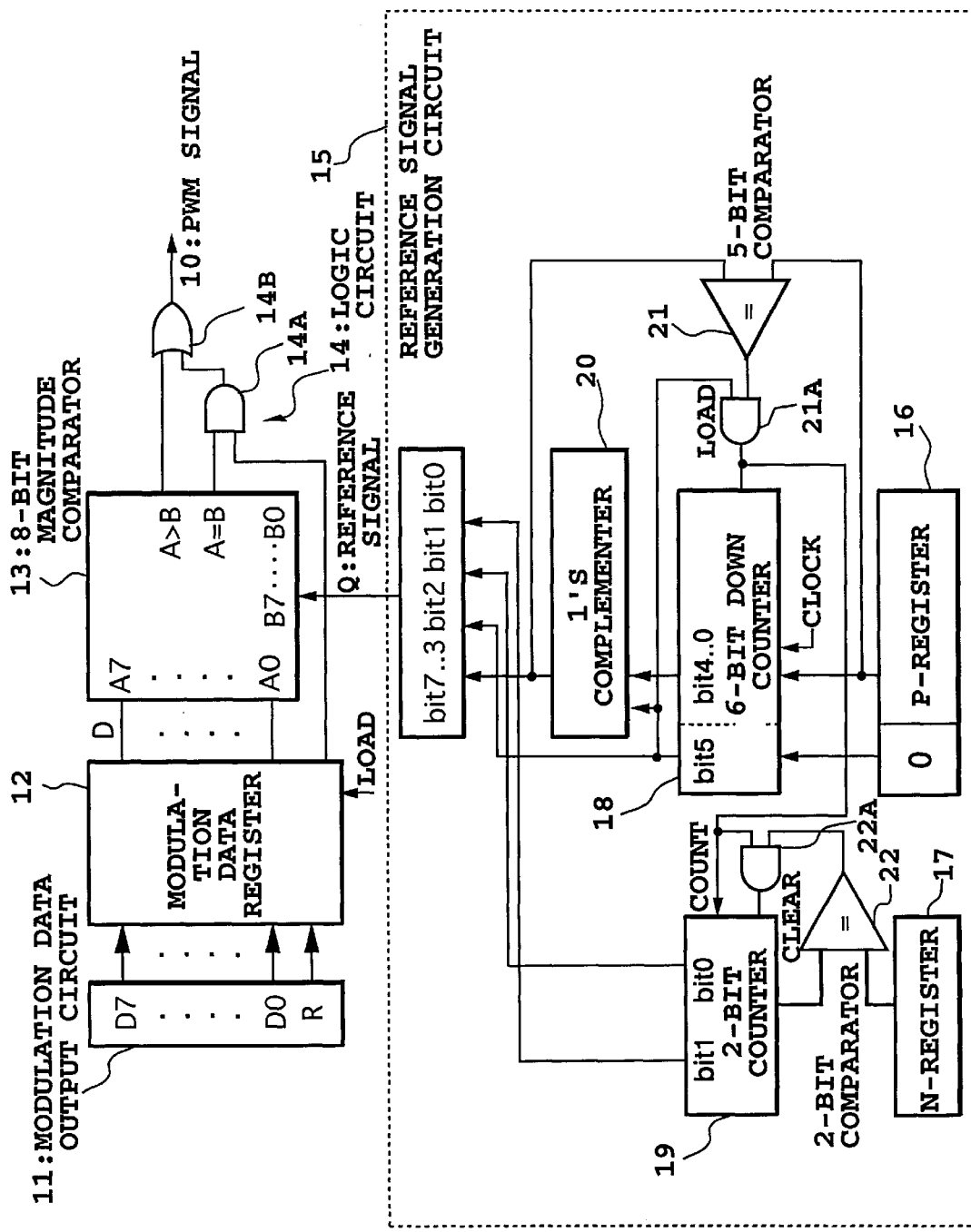
FIG. 8 is a block diagram of a second embodiment of the present invention.

FIG. 8 shows a PWM circuit example in which with 8 bits a carrier frequency is raised to power of 24 with respect to the updating frequency of modulation data. Each time a signal is input to the load input terminal of a modulation data register 12, the 8-bit modulation data D=[D7, . . . , D0] from a modulation data output circuit 11, latched (updated) by the modulation data register 12, is input to the A inputs (A0 to A7) of an 8-bit magnitude comparator 13. At the same time, an 8-bit reference signal Q (to be described later) is input to the B inputs (B0 to B7) of the 8-bit magnitude comparator 13. In the 8-bit magnitude comparator 13, the magnitudes of the A and B inputs are compared with each other, and when A>B and A=B, the results are obtained from the A>B output and the A=B output. 14 is a logic circuit constituted by an AND gate 14A and an OR gate 14B. The A=B output of the magnitude comparator 8 is input to the upper input terminal of the AND gate 14A, and the bit R to be rounded latched to the modulation data register 12 is input to the lower input terminal of the AND gate 14A. The A>B output of the magnitude comparator 13 is input to the upper input terminal of the OR gate 14B, and the output of the AND gate 14A is input to the lower input terminal of the OR gate 14B. The OR gate 14B outputs a PWM signal 10. Note that the logic circuit 14 is not limited to the constitution shown in FIG. 8 but may be any constitution if it can realize the aforementioned logic. The reference signal Q is produced by a reference signal generation circuit 15 consisting of the following constitution.

A value of [(½ of the number of clocks of the carrier cycle) −1] is set to a P-register 16 (the MSB is zero). On the other hand, a value of [the number of carriers (number of pulses of the PWM signal) per modulation data updating cycle −1] (here, 3) is set to an N-register 17. If a value from the P-register 16 is input to the load input terminal of a 6-bit down counter 18, the 6-bit down counter 18 will load that value and then count the number of clock pluses. In a 1's complementer 20, the exclusive OR between the bit 5 and bits 0 to 4 of the outputs of the 6-bit down counter 18 is performed and output. If the output value of the 1's complementer 20 and the value of the P-register 16 are compared by a 5-bit comparator 21 and become equal to each other, then the output of an AND gate 21A, turned on when the bit 5 of the 6-bit down counter 18 is 1, will be input to the count input terminal of a 2-bit counter 19, and the 2-bit counter 19 will be counted up. On the other hand, the output of the AND gate 21A is input to the load input terminal of the 6-bit down counter 18. The 6-bit down counter 18 loads the value of the P-register 16 again, whereby an inverted isosceles triangle signal is generated (see FIG. 9). Note that if the value of the N-register 17 and the output of the 2-bit counter 19 are compared by a 2-bit comparator 22 and become equal to each other, then the output of an AND gate 22A, turned on when the AND gate 21A is on, will be input to the clear input terminal of the 2-bit counter 19. According to such constitution, a desired reference signal can be obtained if the output of the 1's complementer 20 is taken to be the bits 3 to 7 of the 8-bit reference signal Q, the MSB of the 6-bit down counter 18 to be the bit 2 of the 8-bit reference signal Q. and the bit 0 and bit 1 of the 2-bit counter 19 to be the bit 1 and bit 0 of the 8-bit reference signal Q. Also, among signals input to the 1's complementer 20, each logic of lower (m+1) bits can be arbitrarily inverted, for example, by a required number of inverters.

Figure 9:
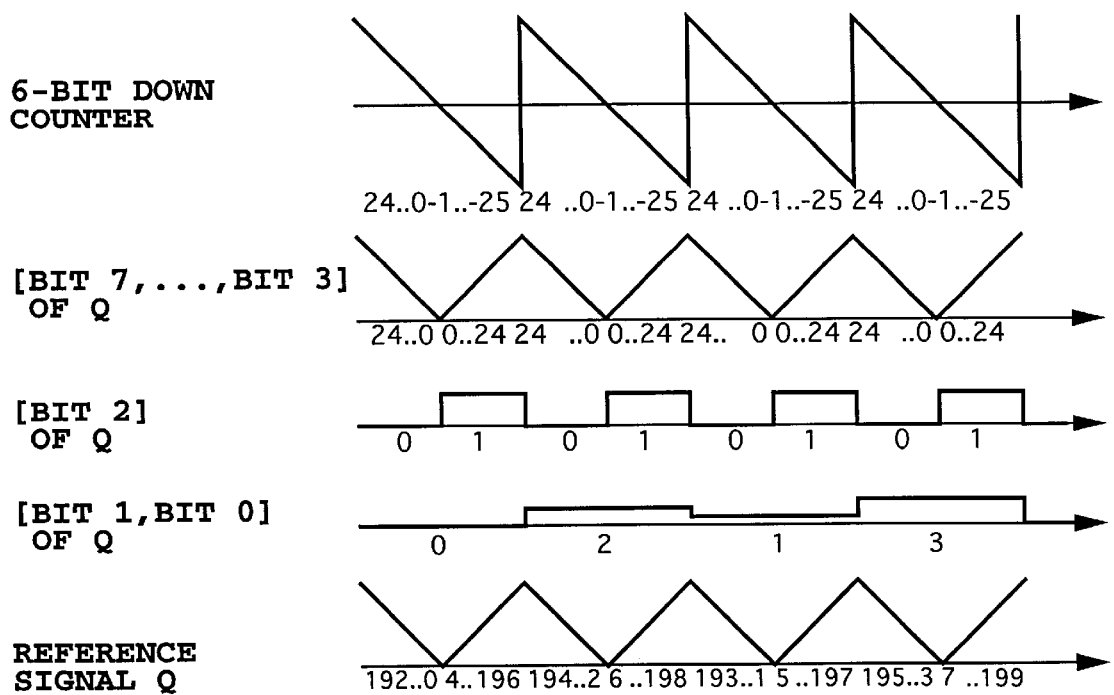
FIG. 9 is a diagram used to explain the input and output signals of each section of a reference signal generation circuit.
Figure 10:
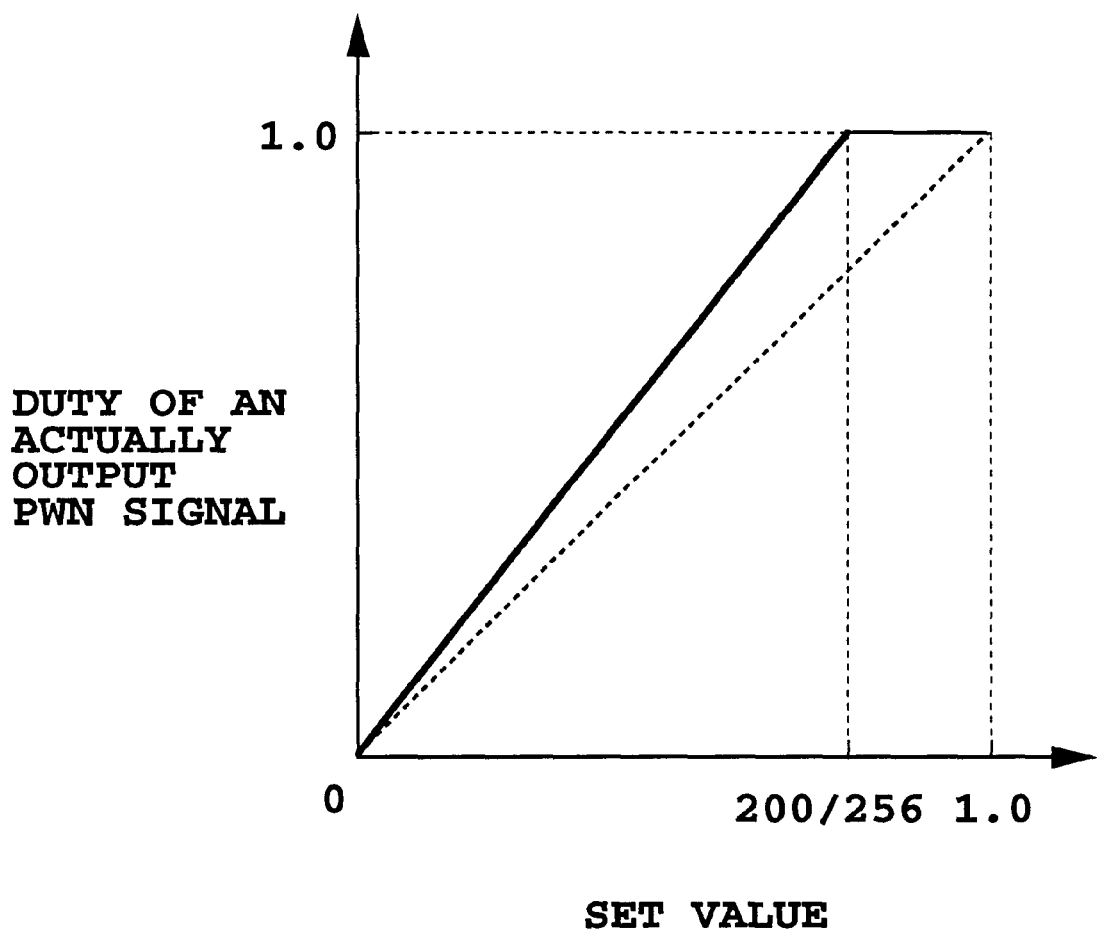
FIG. 10 is a diagram showing the relation between modulation data and the duty cycle of a PWM signal.

As an example of this, consider that a clock is 1 MHz, also the updating frequency of modulation data is 5 kHz, and a carrier frequency is 20 kHz which is 4 times the updating frequency. Since there are 50 clock pluses in the carrier cycle, 24 is set to the P-register 16 and 3 is set to the N-register 17. The output waveform of each part is obtained as shown in FIG. 9. If modulation is performed based on the obtained reference signal, the output waveform will have 200 levels equal to the number of clock pulses per modulation data updating cycle, and a PWM signal whose pulsating component is smallest will be obtained. The relation between the set modulation data and the duty of the actually output PWM signal is obtained as shown in FIG. 10. It is found that although the gain is not 1, a linear characteristic is obtained when the duty is between 0 and 1.

Figure 11:
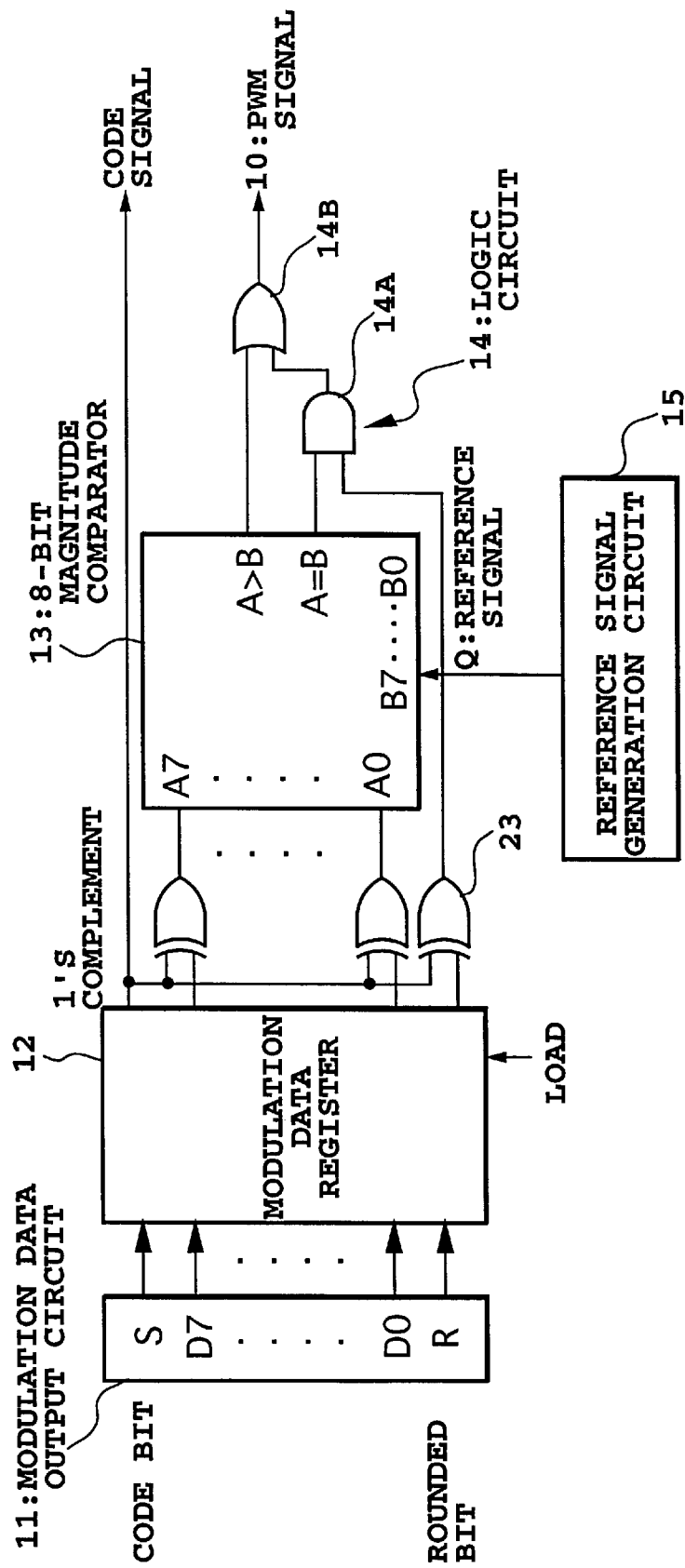
FIG. 11 is a block diagram of a third embodiment of the present invention.

FIG. 11 shows a PWM circuit according to a third embodiment of the present invention, which processes modulation data expressed in 2's complement. The data output from a modulation data output circuit 11 has sign bit S, 8-bit modulation data D=[D7, . . . , D0], and bit R to be rounded. These bits are latched (or updated) by a modulation data register 12 each time a signal is input to the load input terminal of the modulation data register 12. The sign bit S from this register 12 is output as a sign signal and is input to a 1's complementer 23. The 1's complementer 23 consists of 9 exclusive OR gates and performs the exclusive OR between the sign bit S of the modulation data output circuit 11 and each of the remaining bits. The outputs of the 1's complementer 23, excluding the LSB, i.e., the exclusive OR between the sign bit S and the bit R to be rounded, are input to the A inputs (A7 to A0) of an 8-bit magnitude comparator 13. The exclusive OR between the sign bit S and the bit R to be rounded is input to one of the input terminals of the AND gate 14A of the rounding circuit 14. Reference signal Q from a reference signal generation circuit 15 (which is the same as FIG. 8) is input to the B inputs (B7 to B0) of the magnitude comparator 13. The remaining constitution of the logic circuit 14 is the same as FIG. 8, and a PWM signal with respect to modulation data, expressed in 2's complement, is obtained from the output of the logic circuit 14.

Figure 12:
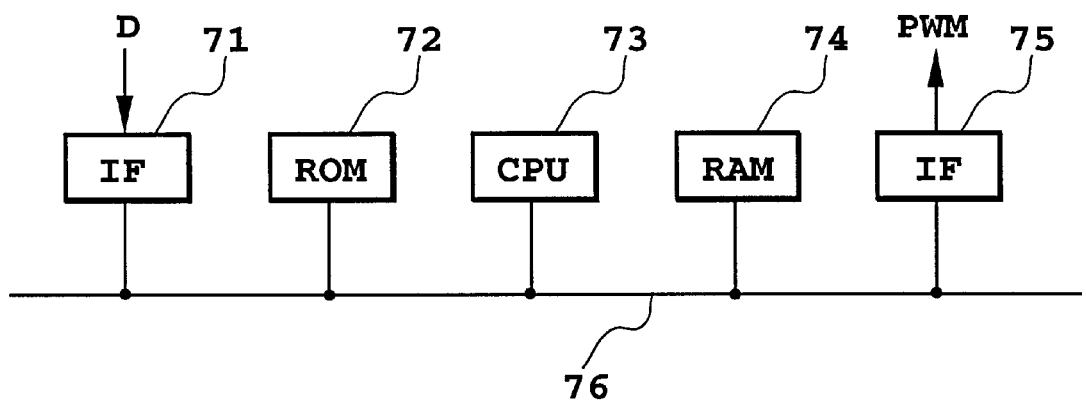
FIG. 12 is a block diagram of a fourth embodiment of the present invention.

The aforementioned embodiments can be realized by software having constitution shown in FIG. 12. As shown in the figure, an input interface 71, a ROM 72, a CPU 73, a RAM 74, and an output interface 75 are connected onto a bus 76. The CPU 73 controls the input interface 71, the ROM 72, and the RAM 74. The ROM 72 stores a control program which causes the CPU 73 to execute the functions of the aforementioned ring counter 1, logic circuit 2, magnitude comparators 3 and 13, and reference signal generation circuit 15. The RAM 74 provides the operating region of the CPU 73. The modulation data D is input to the input interface 71, and the PWM signal is output from the output interface 75. That is, according to the control program in the ROM 72, the CPU 73 generates an n-bit signal (corresponding to signal C), which increases or decreases stepwise in sequence and is reiterated at a predetermined frequency. This generated signal is converted to a signal (corresponding to reference signal Q) which repeats a sequential decrease and a sequential increase or repeats a sequential increase and a sequential decrease at a frequency which gradually increases the predetermined frequency. The modulation data D input to the input interface 71 is compared with the aforementioned signal equivalent to the reference signal Q (aforementioned A>B and A=B) to generate a PWM signal, and the PWM signal is output from the output interface 75. Also, the functions of the logic circuit 14 described in FIGS. 8 and 11 and the 1's complementer 23 of FIG. 11 are executed as occasion demands.

As described above, the present invention has the following advantages.

A PWM circuit and method which has no phase change and high resolution and can gradually increase the carrier frequency arbitrarily at the low pulsating component can be realized with a simple digital circuit.

In addition, the present invention can provide a PWM circuit and method which can generate a good PWM signal even when the carrier cycle is not equal to the clock cycle raised to second power, and therefore, the PWM circuit and method requires no additional exclusive clock pulse.

Furthermore, the present invention can provide a PWM circuit and method which can be realized inexpensively with a little analog waveform degradation in the case where the PWM circuit is applied to a D/A converter and a little controllability degradation in the case where the PWM circuit is applied to power control.

Moreover, the present invention can provide a PWM circuit and method in which modulation of two's complement data and a rounding function can be realized with simple circuitry by making unnecessary a 1-adder which was required in prior art, and therefore, the present invention can provide a PWM circuit and method which is capable of eliminating the problems that an offset of ½ LSB occurs when a lower bit is omitted instead of being rounded by a rounding function and that a positive 100% duty cycle cannot be output.

What is claimed is:

1. A pulse width modulation circuit comprising:
    signal output means for outputting an n-bit signal reiteratedly at a predetermined frequency, said n-bit signal increasing or decreasing stepwise in sequence to a predetermined value;
    conversion means for converting said n-bit signal output from said signal output means to a reference signal which reiterates a sequential decrease and a sequential increase or reiterates a sequential increase and a sequential decrease at a frequency which gradually increases said predetermined frequency;
    modulation signal output means-for outputting modulation signal; and
    comparison means for comparing said modulation signal output from said modulation signal output means with said reference signal output from said conversion means and then to output the result of comparison as a pulse width modulation signal.

2. The pulse width modulation circuit as set forth in claim 1, wherein said conversion means converts all bit values of said n-bit signal so that one of the even and odd bit values decreases or increases in sequence in the first half cycle of the cycle of said reference signal and also the other of the even and odd bit values increases or decreases in sequence in the remaining half cycle, when the reference signal with the same cycle as that of said n-bit signal output from said signal output means is output.

3. The pulse width modulation circuit as set forth in claim 1, wherein said conversion means has exclusive NOR circuits, the number of said exclusive NOR circuits being less than the number of bits of said n-bit signal by one, and for input and output bits with respect to said exclusive NOR circuits, the input most significant bit being connected to the output least significant bit of output bits and also being connected to first input terminals of said exclusive NOR circuits, the output terminals of said exclusive NOR circuits being connected to the remaining output bits in sequence in order of higher bits, and the remaining input bits being connected in sequence in order of bits closer to said most significant bit to second input terminals of said exclusive NOR circuits connected in order of said connection.

4. The pulse width modulation circuit as set forth in claim 1, wherein in said conversion means, an n-bit signal expressed by $C=[C_{n-1}, C_{n-2}, \ldots, C_1, C_0]$ is converted to a reference signal expressed as $$Q = [\overline{C_{n-m-2} \oplus C_{n-m-1}}, \ldots, \overline{C_1 \oplus C_{n-m-1}}, \overline{C_0 \oplus C_{n-m-1}}, C_{n-m-1}, \ldots, C_{n-2}, C_{n-1}]$$

where Q is the reference signal, $\oplus$ is an exclusive OR, and $m=0, 1, \ldots,$ and $(n-1)$.

5. The pulse width modulation circuit as set forth in claim 4, wherein said conversion means arbitrarily inverts and outputs lower (m+1) bits of said reference signal Q.

6. The pulse width modulation circuit as set forth in any of claims 1 through 5, wherein said modulation signal further has a bit to be rounded and wherein said comparison means has:
    a comparator having input terminals A to which bits of said modulation signal excluding said bit to be rounded are input and input terminals B to which output bits of said reference signal output means are input, said comparator outputting comparison results A>B and A=B of both inputs;
    a first logic circuit for outputting a logical product between said comparison result A=B and said bit to be rounded; and
    a second logic circuit for outputting a logical sum between said logical product of said first logic circuit and said comparison result A>B as said pulse width modulation signal.

7. The pulse width modulation circuit as set forth in claim 1, 4, or 5, wherein said signal output means has an (n−m) bit down counter where $m=0, 1, \ldots,$ and $(n-1)$ and wherein said conversion means has:
    a logic circuit for making an exclusive OR between the bit (n−m−1) and bits 0 to (n−m−2) of said (n−m) bit down counter equal to the bits (m+1) to (n−1) of said reference signal;
    means for making the most significant bit of said (n−m) bit down counter equal to the bit m of said reference signal; and
    an m-bit counter for performing counting once in 1 cycle of said (n−m) bit down counter and make the bits 0 to (m−1) of said (n−m) bit down counter equal to the bits (m−1) to 0 of said reference signal.

8. The pulse width modulation circuit as set forth in claim 7, wherein said conversion means arbitrarily inverts and outputs lower (m+1) bits of said reference signal Q.

9. The pulse width modulation circuit as set forth in claim 1, 4, or 5, wherein said conversion means has:
    an n-bit shifter for shifting and output the n-bit signal from said signal output means to an m-bit higher position in response to a set value m;
    (n−1) exclusive NOR circuits each having a first input terminal to which the most significant bit of the outputs of said n-bit shifter is input and a second input terminal to which each bit of the remaining outputs of said n-bit shifter is input;
    switch means including (n−1) switches, each having two input terminals and one output terminal, in response to said set value m the lower m switches each outputting its lower input and the remaining switches each outputting its upper input, and when m =0, all the switches outputting upper inputs;
    the outputs of said (n−1) exclusive NOR circuits being input to the upper terminals of said (n−1) switches, and the (n−1) bits of the n-bit signal from said signal output means, excluding the most significant bit, being input to the lower terminals of said (n−1) switches in reversed order; and
    means for outputting the most significant bit of said n-bit signal from said signal output means as the least significant bit of said reference signal, and the outputs of said (n−1) switches of said switch means as the remaining (n−1) higher bits of said reference signal.

10. The pulse width modulation circuit as set forth in claim 9, wherein said conversion means arbitrarily inverts and outputs lower (m+1) bits of said reference signal Q.

11. The pulse width modulation circuit as set forth in claim 1, wherein the frequency of said reference signal from said conversion means is ½ of the updating frequency of said modulation signal and wherein a change point between the increase and decrease of said reference signal is matched with the updating timing of said modulation signal.

12. The pulse width modulation circuit as set forth in any of claims 1 through 5, wherein said modulation signal is data expressed in 2's complement and wherein said comparison means has:

a first logic circuit for outputting an exclusive OR between the sign bit and each of the remaining bits of said modulation signal;

a comparator having an input terminal A to which the output of said first logic circuit is input and an input terminal B to which the output of said conversion means is input, said comparator outputting comparison results A>B and A=B of both inputs;

a second logic circuit for outputting a logical product between said comparison result A=B and said sign bit; and a third logic circuit for outputting a logical sum between said logical product of said second logic circuit and said comparison result A>B as said pulse width modulation signal.

13. The pulse width modulation circuit as set forth in claim 12, wherein:

said modulation signal further has a bit to be rounded;

said first logic circuit further outputs an exclusive OR between said bit to be rounded and the sign bit of said modulation signal; and said second logic circuit outputs a logical product between said exclusive OR from said first logic circuit and said comparison result A=B.

14. A pulse width modulation method comprising the teps of:

converting an n-bit signal to a reference signal which reiterates a sequential decrease and a sequential increase or reiterates a sequential increase and a sequential decrease at a frequency which gradually increases a predetermined frequency, said n-bit signal increasing or decreasing stepwise in sequence and being reiterated at said predetermined frequency; and comparing a modulation signal and said reference signal with each other and outputting the result of comparison as a pulse width modulation signal.

15. The pulse width modulation method as set forth in claim 14, wherein in said conversion, an n-bit signal expressed by $C=[C_{n-1}, C_{n-2}, \ldots, C_1, C_0]$ is converted to a reference signal expressed as $$Q = [\overline{C_{n-m-2} \oplus C_{n-m-1}}, \ldots, \overline{C_1 \oplus C_{n-m-1}}, \overline{C_0 \oplus C_{n-m-1}},$$
$$C_{n-m-1}, \ldots, C_{n-2}, C_{n-1}]$$

where Q is the reference signal, $\oplus$ is an exclusive OR, and m=0, 1, . . . , and (n−1), and lower (m+1) bits of said reference signal Q can be arbitrarily inverted.

16. The pulse width modulation circuit as set forth in claim 2, wherein said conversion means has exclusive NOR circuits, the number of said exclusive NOR circuits being less than the number of bits of said n-bit signal by one, and for input and output bits with respect to said exclusive NOR circuits, the input most significant bit being connected to the output least significant bit of output bits and also being connected to first input terminals of said exclusive NOR circuits, the output terminals of said exclusive NOR circuits being connected to the remaining output bits in sequence in order of higher bits, and the remaining input bits being connected in sequence in order of bits closer to said most significant bit to second input terminals of said exclusive NOR circuits connected in order of said connection.

\* \* \* \* \*

UNITED STATES PATENT AND TRADEMARK OFFICE
CERTIFICATE OF CORRECTION

PATENT NO. : 6,310,913 B1
DATED : October 30, 2001
INVENTOR(S) : Yoji Ishikawa

It is certified that error appears in the above-identified patent and that said Letters Patent is hereby corrected as shown below:

Column 11,
Line 26, "means-for" should read -- means for --.

Column 13,
Line 39, "teps" should read -- steps --.

Signed and Sealed this

Eighteenth Day of February, 2003

JAMES E. ROGAN
*Director of the United States Patent and Trademark Office*